(12) United States Patent
Taguchi et al.

(10) Patent No.: US 8,878,357 B2
(45) Date of Patent: Nov. 4, 2014

(54) ELECTRONIC COMPONENT DEVICE, METHOD OF MANUFACTURING THE SAME AND WIRING SUBSTRATE

(75) Inventors: Yuichi Taguchi, Nagano (JP); Akinori Shiraishi, Nagano (JP); Mitsutoshi Higashi, Nagano (JP)

(73) Assignee: Shinko Electric Industries Co., Ltd., Nagano-shi (JP)

(*) Notice: Subject to any disclaimer, the term of this patent is extended or adjusted under 35 U.S.C. 154(b) by 184 days.

(21) Appl. No.: 13/221,064

(22) Filed: Aug. 30, 2011

(65) Prior Publication Data
US 2012/0086116 A1 Apr. 12, 2012

(30) Foreign Application Priority Data
Oct. 12, 2010 (JP) .................. 2010-229309

(51) Int. Cl.
| | |
|---|---|
| *H01L 23/04* | (2006.01) |
| *H01L 21/50* | (2006.01) |
| *H01L 21/683* | (2006.01) |
| *H01L 23/10* | (2006.01) |
| *B81B 7/00* | (2006.01) |
| *H01L 23/055* | (2006.01) |
| *H01L 23/00* | (2006.01) |
| *H01L 23/13* | (2006.01) |

(52) U.S. Cl.
CPC ....... *H01L 23/10* (2013.01); *H01L 2924/01023* (2013.01); *H01L 2924/01033* (2013.01); *H01L 24/16* (2013.01); *H01L 21/50* (2013.01); *H01L 2924/01079* (2013.01); *H01L 21/6835* (2013.01); *H01L 2224/0401* (2013.01); *H01L 2924/01006* (2013.01); *H01L 2224/81192* (2013.01); *H01L 2924/014* (2013.01); *H01L 24/81* (2013.01); *H01L 2224/81444* (2013.01); *H01L 2924/01049* (2013.01); *H01L 2224/05644* (2013.01); *H01L 2224/81203* (2013.01); *H01L 2924/01057* (2013.01); *B81B 7/0048* (2013.01); *B81C 2203/019* (2013.01); *H01L 2924/01029* (2013.01); *H01L 2224/81409* (2013.01); *H01L 23/13* (2013.01); *H01L 2224/81191* (2013.01); *H01L 2224/13109* (2013.01); *H01L 2221/68372* (2013.01); *H01L 2924/01005* (2013.01); *H01L 23/055* (2013.01); *H01L 24/13* (2013.01); *H01L 2224/81815* (2013.01); *H01L 2924/01082* (2013.01)
USPC .......... 257/698; 257/700; 257/774; 257/778; 257/E23.011; 257/E23.181

(58) Field of Classification Search
None
See application file for complete search history.

(56) References Cited

U.S. PATENT DOCUMENTS

| | | | |
|---|---|---|---|
| 7,456,502 | B2 | 11/2008 | Tanida et al. |
| 8,178,957 | B2 | 5/2012 | Taguchi et al. |

(Continued)

FOREIGN PATENT DOCUMENTS

| | | |
|---|---|---|
| JP | 2006-100552 | 4/2006 |
| JP | 2006-179667 A1 | 7/2006 |

(Continued)

OTHER PUBLICATIONS

Office Action from the Japanese Patent Office mailed Jan. 21, 2014 in counterpart application No. 2010-229309 with English translation.

*Primary Examiner* — Yasser A Abdelaziez
(74) *Attorney, Agent, or Firm* — Kratz, Quintos & Hanson, LLP

(57) ABSTRACT

An electronic component device includes a substrate, an electrode post made of a metal material, provide to stand on the substrate, and an electronic component whose connection electrode is connected to the electrode post, wherein the connection electrode of the electronic component and the electrode post are joined by an alloy layer including a metal which is different from the metal material of the electrode post.

5 Claims, 11 Drawing Sheets

(56) References Cited

U.S. PATENT DOCUMENTS

2010/0096713 A1* 4/2010 Jung .......................... 257/415
2010/0207218 A1* 8/2010 Taguchi et al. ............. 257/415

FOREIGN PATENT DOCUMENTS

JP     2010-103479     5/2010
JP     2010-192696     9/2010

* cited by examiner

ELECTRONIC COMPONENT DEVICE, METHOD OF MANUFACTURING THE SAME AND WIRING SUBSTRATE

CROSS-REFERENCE TO RELATED APPLICATIONS

This application is based upon and claims the benefit of priority of the prior Japanese Patent Application No. 2010-229309, filed on Oct. 12, 2010, the entire contents of which are incorporated herein by reference.

FIELD

It is related to an electronic component device, a method of manufacturing the same and a wiring substrate.

BACKGROUND

In the prior art, there is a MEMS (Micro Electro Mechanical Systems) element in which minute electric elements and mechanical elements are installed on a one substrate by applying the micro-fabrication technology of the semiconductor manufacturing technology or laser processing technology or the like. As the MEMS element, there is an acceleration sensor, a pressure sensor or a gyroscope or the like.

Such a MEMS element is mounted on a wiring substrate, and a cap is provided on the MEMS element, thus the MEMS element is hermetically sealed in the package with a vacuum state. Since the MEMS element has the movable portion, it is necessary to mount and separate the movable portion from the wiring substrate such that the movable portion is in the free state. In the case that the MEMS element is mounted with an adhesive, the levelness can not be obtained sufficiently, and the vacuum airtightness is not enough due to the volatilization of the constituent in the adhesive.

A related art is disclosed in Japanese Laid-open Patent Publication No. 2006-179667.

SUMMARY

According to one aspect discussed herein, there is provided an electronic component device, including a substrate, an electrode post made of a metal material, provided to stand on the substrate, and an electronic component whose connection electrode is connected to the electrode post, wherein the connection electrode of the electronic component and the electrode post are joined by an alloy layer including a metal which is different from the metal material of the electrode post.

According to another aspect discussed herein, there is provided a method of manufacturing an electronic component device, including forming an electrode structure including a electrode post made of a metal material, and a joining metal layer made of a metal which is different from the metal material, provided on the electrode post, on the substrate, and connecting a connection electrode of the electronic component to the electrode structure, wherein the connection electrode of the electronic component is joined by an alloy layer of the joining metal layer and the connection electrode.

According to further another aspect discussed herein, there is provided a wiring substrate, including a substrate, an electrode post made of a metal material, and provide to stand on the substrate, and a joining metal layer made of a metal which is different from the metal material, formed on the electrode post.

DESCRIPTION OF EMBODIMENT

An embodiment will be explained with reference to the accompanying drawings hereinafter.

Prior to the explanation of embodiments, the related art (preliminary matter) will be explained hereunder.

Figure 1:
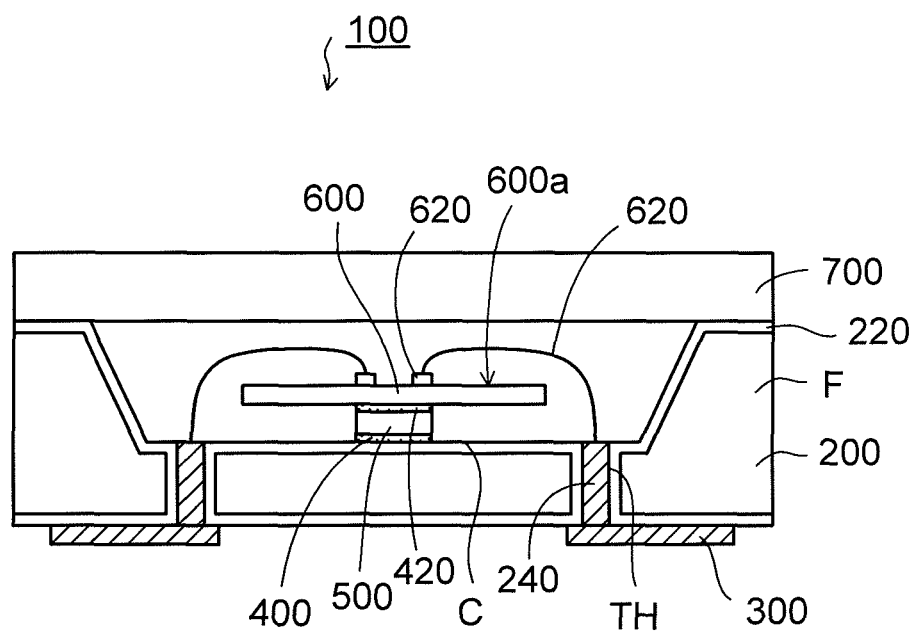
FIG. 1 is a sectional view depicting an electronic component device according to the related art.

As depicted in FIG. 1, in an electronic component device 100 in the related art, a cavity C is provided in a center part of a silicon substrate 200 which is arranged to a lower side, and a frame portion F like a ring shape is provided upright to a periphery of the silicon substrate 200.

Through holes TH which penetrate from an upper surface to a lower surface of the silicon substrate 200 are provided in a bottom part side of the cavity C of the silicon substrate 200. An insulating layer 220 is formed on both surfaces of the silicon substrate 200 and the inner surfaces of the through holes TH. And a penetration electrode 240 is filled in the through holes TH respectively. Further, wiring layers 300 which are connected to the penetration electrodes 240 are formed on the lower surface of the silicon substrate 200.

A pedestal 500 is fixed to the bottom surface center part of the cavity C of the silicon substrate 200 by first adhesive 400. Further, a back surface of a MEMS element 600 (acceleration sensor) is fixed on the pedestal 500 by a second adhesive 420 in a state that connection electrodes 620 of MEMS element 600 are directed upward A movable portion 600a of the MEMS element 600 is arranged to separate from the silicon substrate 200 by the thickness of the pedestal 500 and the first and second adhesive 400, 420. By this matter, the MEMS element is mounted on the silicon substrate 200 such that the movable portion 600a thereof is in the free state.

The connection electrodes 620 of the MEMS element 600 are electrically connected to the upper surface of the penetration electrode 240 provided in the silicon substrate 200 by the wires 620.

Further, a cap 700 is joined to the frame portion F of the silicon substrate 200, thus the MEMS element 600 is hermetically sealed in the cavity C with the vacuum state.

In order to draw out the performance of the high-performance MEMS element 600 sufficiently, it is necessary that the MEMS element 600 is arranged in a state that the levelness is high and the MEMS element 600 is hermetically sealed with sufficient vacuum state.

In the related art, the MEMS element 600 is fixed by the second adhesive 420 on the pedestal 500 fixed by the first adhesive 400. Therefore, the MEMS element 600 is easy to arranged with an inclined state by the variation or the like of the first and second adhesive 400, 410, and the sufficient levelness can not often be obtained.

Also, when the MEMS element 600 is hermetically sealed by the cap 700 with the vacuum atmosphere, because the constituents in the first and second adhesive 400, 420 volatilize, such a problem exists that the sufficient vacuum degree can not be obtained in the cavity C.

Respective embodiments explained hereinafter can overcome the drawbacks discussed above.

(First Embodiment)

Figure 7A:
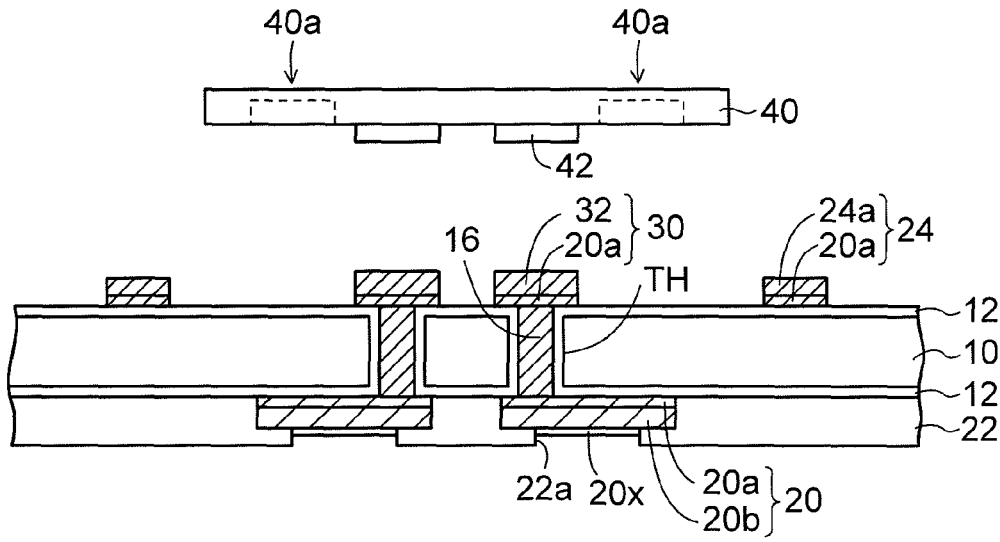
FIGS. 7A and 7b are sectional views (#6) depicting a method of manufacturing an electronic component device according to a first embodiment.
Figure 7B:
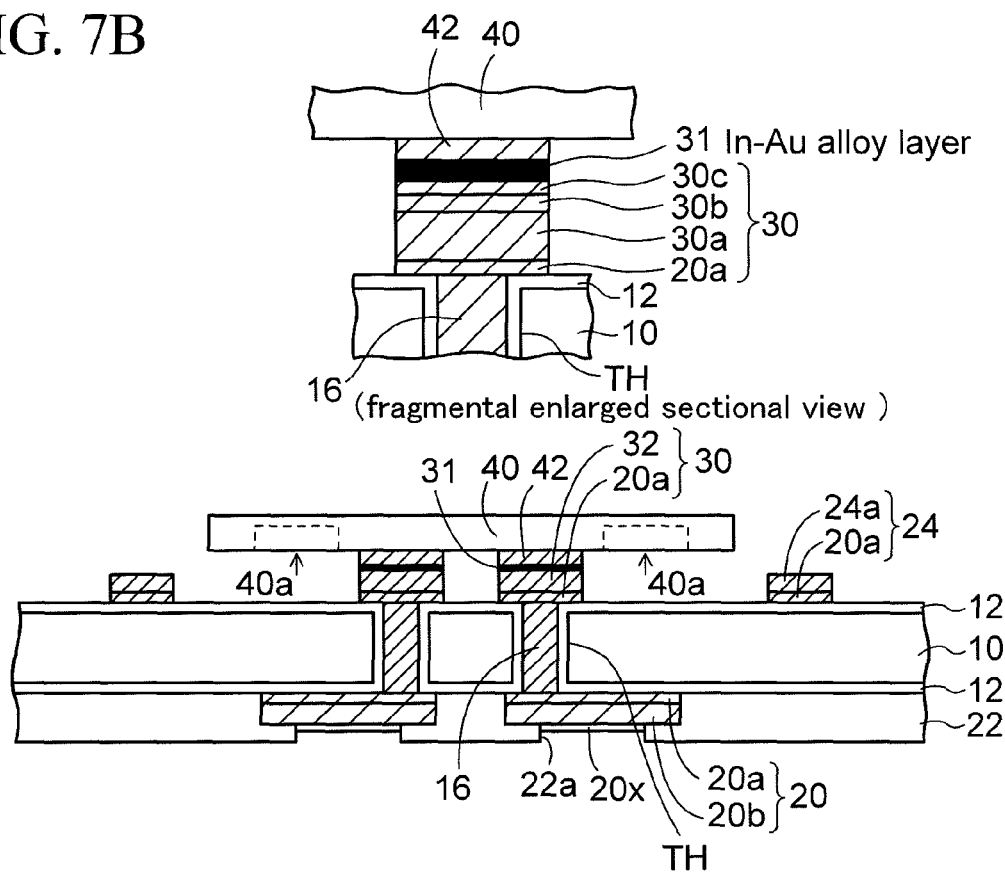
Figure 8A:
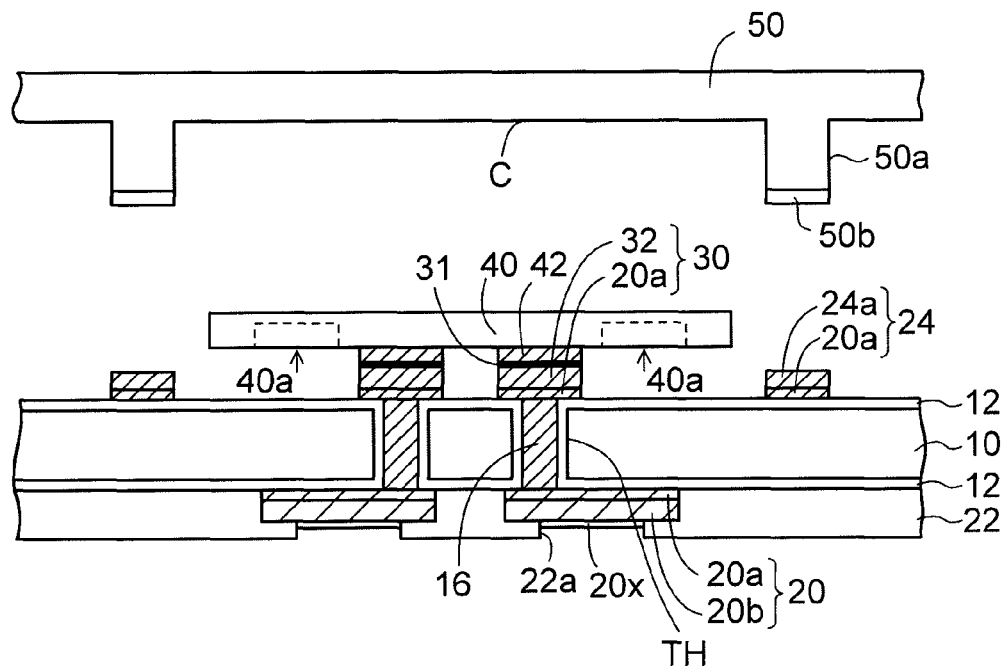
FIGS. 8A and 8b are sectional views (#7) depicting a method of manufacturing an electronic component device according to a first embodiment.
Figure 8B:
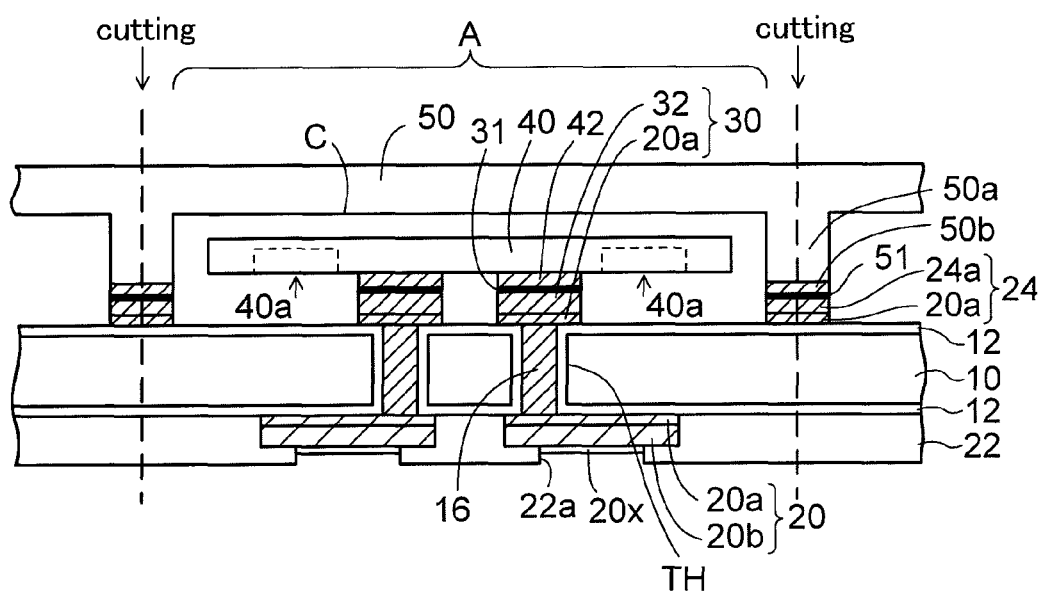
Figure 9:
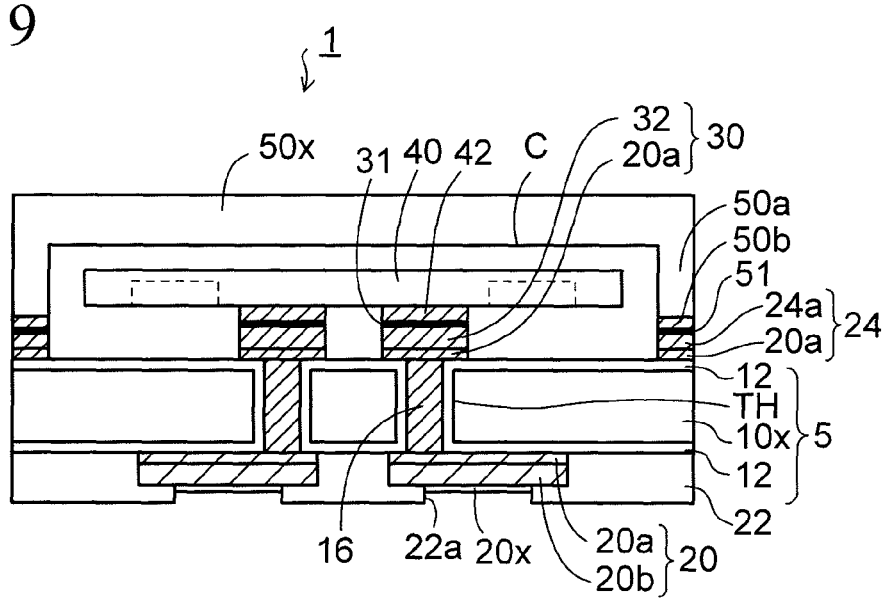
FIG. 9 is a sectional view depicting an electronic component device according to a first embodiment.

FIG. 2A to FIG. 8B are sectional views depicting a method of manufacturing an electronic component device according to a first embodiment, and FIG. 9 is a sectional view depicting an electronic component device according to a first embodiment.

Figure 2A:
FIGS. 2A to 2d are sectional views (#1) depicting a method of manufacturing an electronic component device according to a first embodiment.

In the method of manufacturing the electronic component device according to the first embodiment, as depicted in FIG. 2A, first, a first silicon wafer 10 for obtaining the wiring substrate is prepared. A thickness of the first silicon wafer 10 is set to about 600 to 700 µm.

Figure 2B:
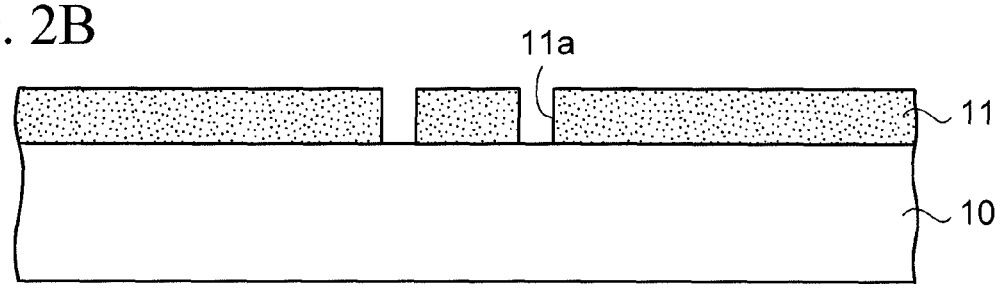

Then, as depicted in FIG. 2B, a resist 11 in which opening portions 11a are provided at the positions where through holes are arranged is formed on the first silicon wafer 10 by the photolithography.

Figure 2C:
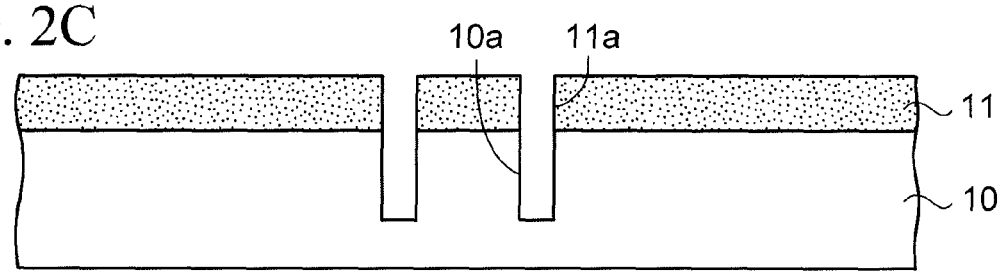

Then, as depicted in FIG. 2C, the first silicon wafer 10 is etched from the upper surface thereof to the halfway position of the thickness by means of the anisotropic dry etching (RIE or the like) through the opening portions 11a by utilizing the resist 11 as a mask, thus hole portions 10a are formed. Subsequently the resist 11 is removed.

Figure 2D:
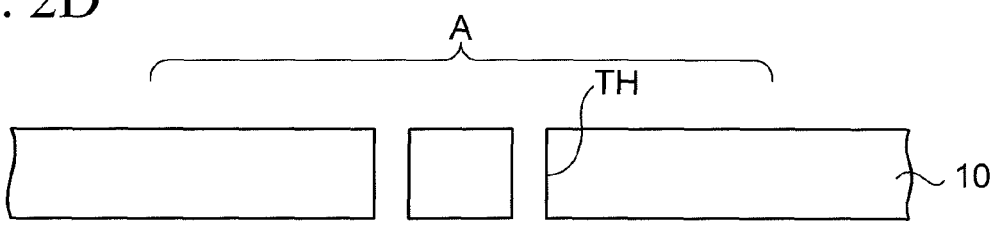

Then, as depicted in FIG. 2D, the first silicon wafer 10 is ground from the back surface side thereof by BG (back grinder), thus the hole portions 10a are exposed. By this matter, the hole portions 10a of the first silicon wafer 10 become through holes TH which penetrate to the thickness direction of the first silicon wafer 10.

In this way, such a situation is obtained that the through holes TH are provided in the first silicon wafer 10 whose thickness is made thin from 200 to 400 µm. The cross-section surface of the horizontal direction in the through hole TH is formed as the circle shape, for example.

Figure 3A:
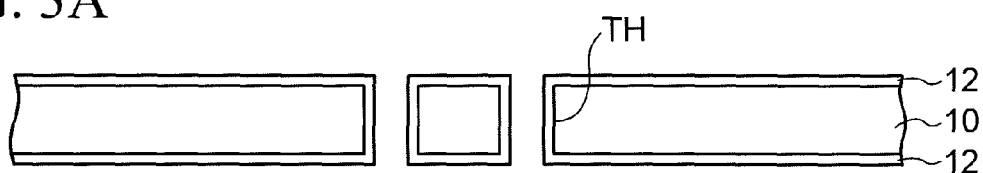
FIGS. 3A to 3d are sectional views (#2) depicting a method of manufacturing an electronic component device according to a first embodiment.

A plurality of element mounting areas A are defined in the first silicon wafer 10, and a plurality of through holes TH are arranged in each element mounting area A respectively. In FIG. 2D, one element mounting area A in the first silicon wafer 10 is illustrated Then, as depicted in FIG. 3A, an insulating layer 12 made of a silicon dioxide layer is formed on the both surfaces of the first silicon wafer 10 and the inner surface of the through hole TH by thermal-oxidizing the first silicon wafer 10. Otherwise, the insulating layer may be obtained by forming the silicon dioxide layer or the silicon nitride layer on the whole surface of the first silicon wafer 10 by CVD method.

Figure 3B:
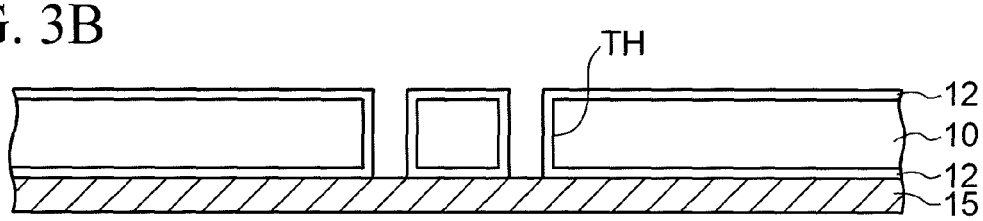
Figure 3C:
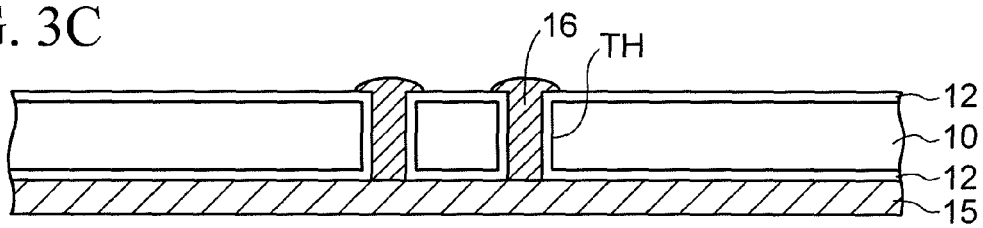

Then, as depicted in FIG. 3B, the first silicon wafer 10 in FIG. 3A is arranged on a conductive member 15 made of a copper foil or the like. Then, as depicted in FIG. 3C, a metal plating such as copper or the like is applied from the lower part of the through holes TH of the first silicon wafer 10 to upper part thereof by the electroplating that utilizes the conductive member 15 as a plating power feeding path, thus penetration electrodes 16 are formed. At this time, the penetration electrode 16 is formed to protrude upward from the insulating layer 12 on the first silicon wafer 10.

Figure 3D:
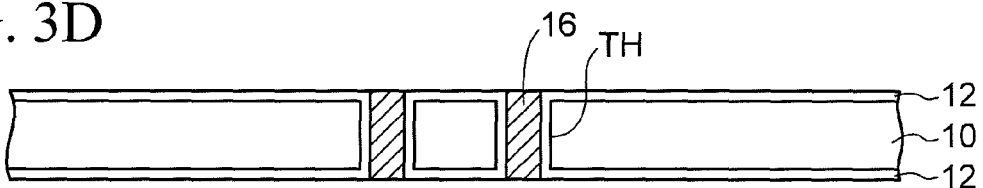

Subsequently, as depicted in FIG. 3D, the conductive member 15 is removed from the first silicon wafer 10. Then, the penetration electrode which protrudes from the upper surface of the first silicon wafer 10 is removed by the polishing, thereby the upper surface side of the first silicon wafer 10 is planarized. The upper surface of the penetration electrode 16 and the upper surface of the insulating layer 12 constitute identical surface, thereby they are planarized.

Figure 4A:
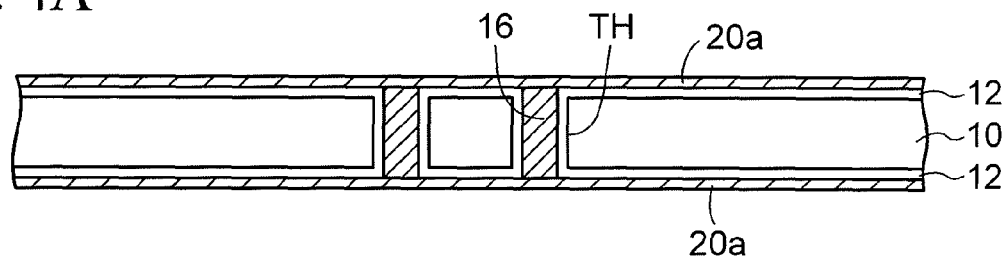
FIGS. 4A to 4d are sectional views (#3) depicting a method of manufacturing an electronic component device according to a first embodiment.

Then, as depicted in FIG. 4A, a seed layer 20a having a thickness of 0.1 µm is obtained on the both surface sides of the first silicon wafer 10 respectively by forming a titanium (Ti) layer/a copper (Cu) layer sequentially on the both surface sides thereof by means of a sputtering method, or the like.

Figure 4B:
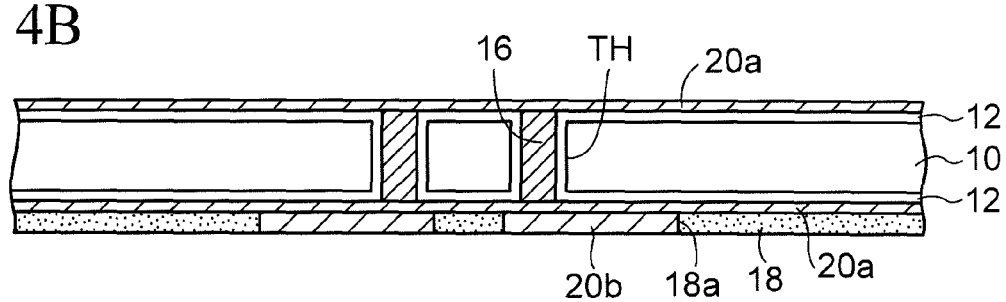

Then, as depicted in FIG. 4B, a plating resist 18 in which opening portions 18a are provided in the parts where wiring layers are arranged is formed on (under in FIG. 4B) the seed layer 20a of the lower surface side of the first silicon wafer 10 by means of the photolithography.

Further, a metal plating layer 20b made of copper or the like is formed in the opening portions 18a of the plating resist 18 by the electroplating that utilizes the seed layer 20a located to the lower side as a plating power feeding path, in a state that the whole upper surface of the first silicon wafer 10 is protected by a protection sheet (not shown).

Then, the plating resist 18 is removed, subsequently the seed layer 20a is etched and removed, while the metal plating layer 20b is utilized as a mask. At this time, the seed layer 20a on an upper surface of the silicon wafer 10 is left.

Figure 4C:
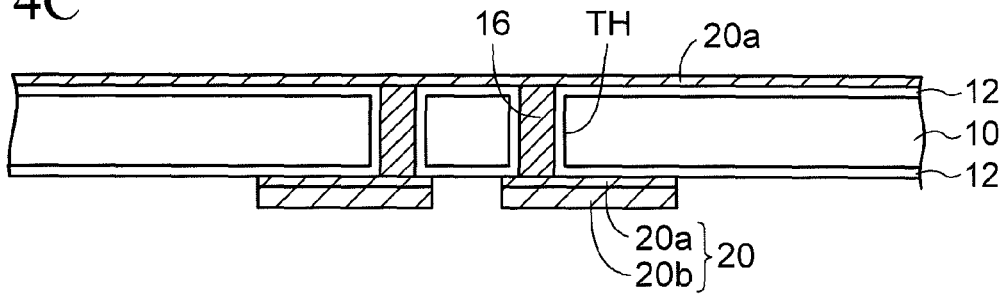

By this matter, as depicted in FIG. 4C, a wiring layer 20 formed from the seed layer 20a and metal plating layer 20b is obtained to the lower surface of the first silicon wafer 10. The wiring layer 20 is formed to be electrically connected to the penetration electrode 16.

Figure 4D:
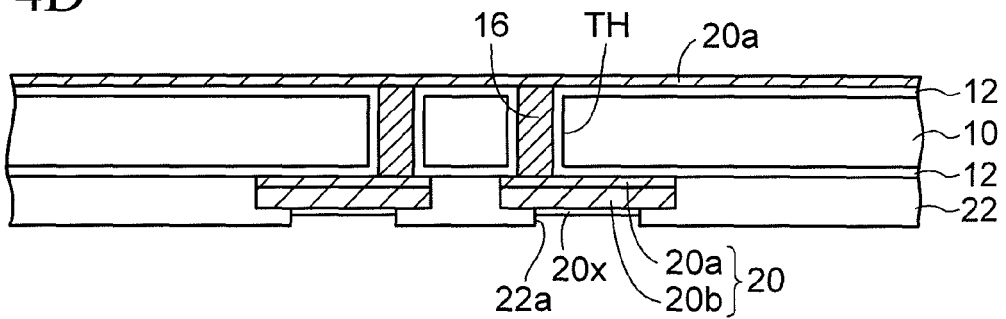

Then, as depicted in FIG. 4D, a solder resist 22 in which opening portions 22a are provided on the connection parts of the wiring layer 20 is formed on the lower surface side of the first silicon wafer 10. Further, a contact layer 20x is obtained by forming a nickel (Ni) layer/a gold (Au) layer sequentially on the connection part of the wiring layer 20 by means of electroless plating, or the like.

Figure 5A:
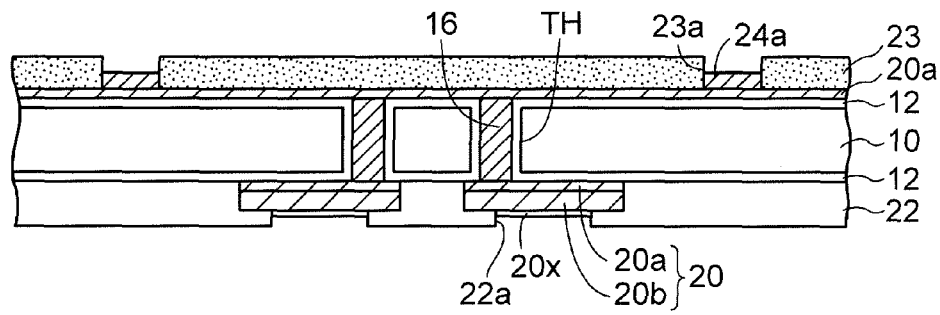
FIGS. 5A to 5c are sectional views (#4) depicting a method of manufacturing an electronic component device according to a first embodiment.

Then, as depicted in FIG. 5A, in the upper surface side of the first silicon wafer 10 in FIG. 4D, a plating resist 23 in which opening portion 23a is provided in the part which becomes a joining part like a ring shape is formed by means of the photolithography.

A Cu layer/a Ni layer/a Au layer are formed sequentially from the bottom in the opening portion 23a of the plating resist 23 by the electroplating that utilizes the seed layer 20a as a plating power feeding path, in a state that the whole lower surface of the first silicon wafer 10 is protected by a protection sheet (not shown), thereby a metal portion 24a is obtained.

Figure 5B:
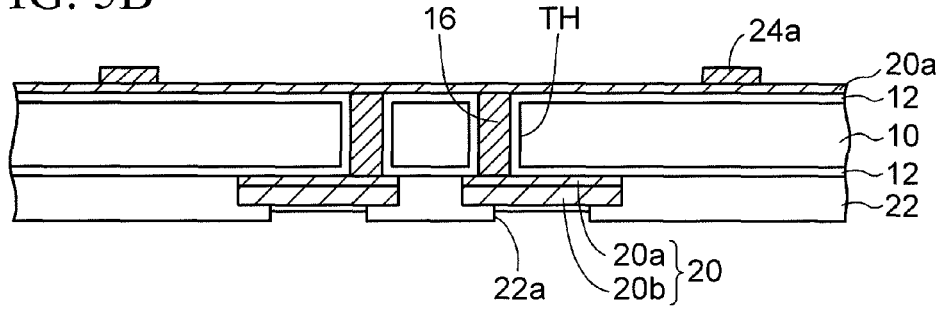

Subsequently, as depicted in FIG. 5B, the plating resist 23 is removed. As mentioned hereinafter, the metal portion 24a functions as a joining portion for joining a cap, and the metal portion 24a is arranged like a ring shape such that the element mounting area A is surrounded by the metal portion 24a.

Figure 5C:
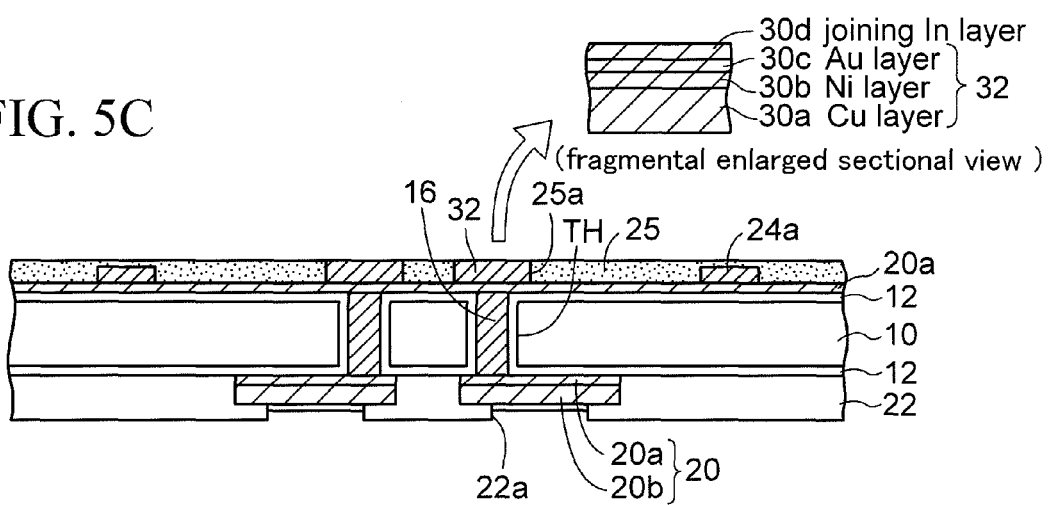

Then, as depicted in FIG. 5C, a plating resist 25 in which opening portions 25a are provided on the seed layer 20a corresponding to the penetration electrode 16 is formed. Further, a metal plating is applied to the opening portions 25a of the plating resist 25 by the electroplating that utilizes the seed layer 20a as a plating power feeding path, in a state that the whole lower surface of the first silicon wafer 10 is protected by a protection sheet (not shown), thereby a metal post 32 and a joining indium (In) layer 30d which is laminated on the metal post 32 are formed.

As depicted in the fragmentary enlarged sectional view of FIG. 5C, the metal post 32 is formed from a Cu layer 30a (thickness: 50 μm)/a Ni layer 30b (thickness: 1 μm)/a Au layer 30c (thickness: 1 μm) sequentially from the bottom, and the joining In layer 30d (thickness: 3 μm) is laminated on the metal post 32. The metal post 32 is formed such that the Cu layer 30a is arranged as a major part in the thickness direction.

Then, the plating resist 25 is removed, Subsequently, the seed layer 20a is etched and removed, while the metal post 32 and the metal portion 24a is utilized as a mask respectively.

Figure 6:
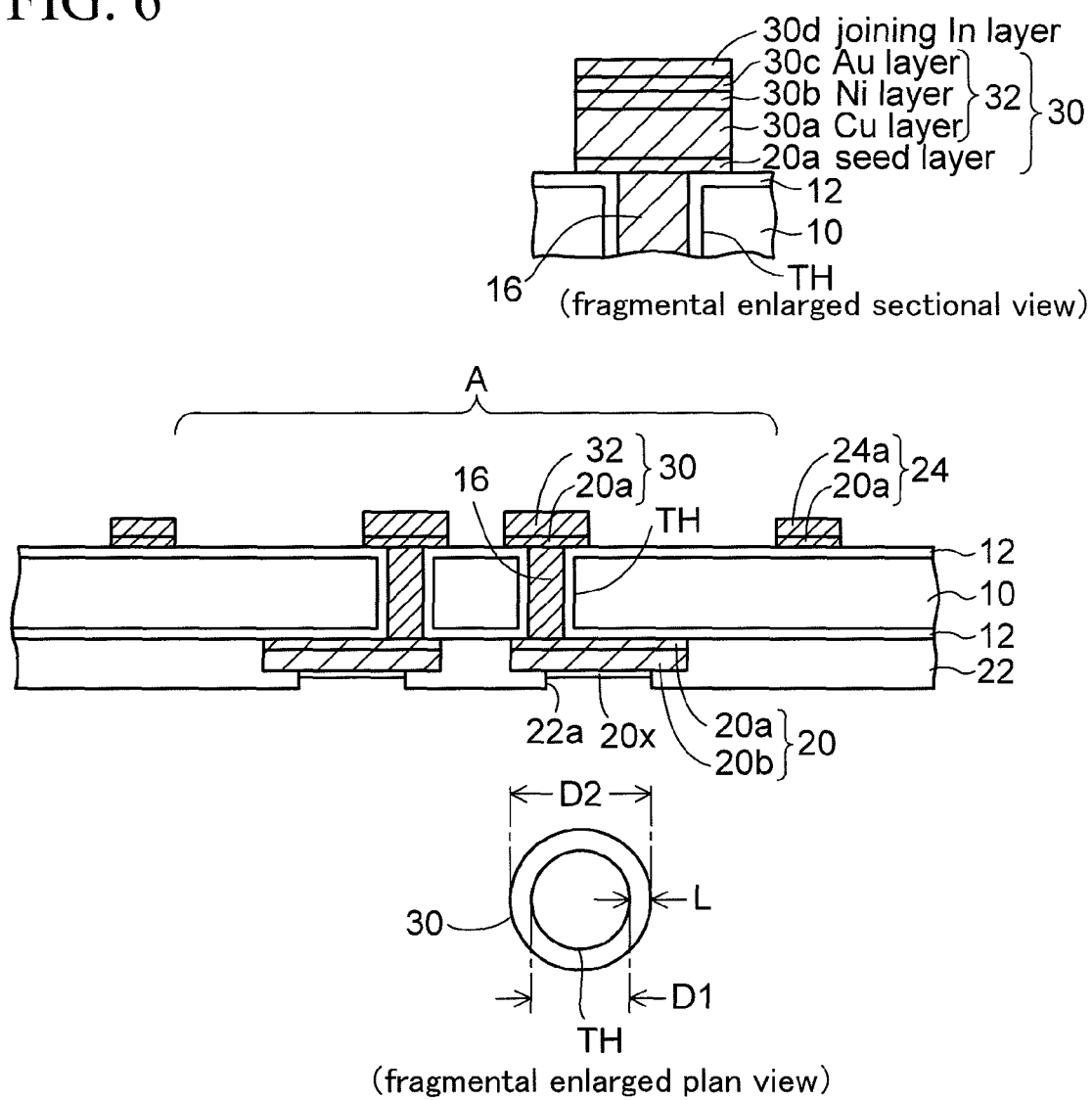
FIG. 6 is a sectional view (#5) depicting a method of manufacturing an electronic component device according to a first embodiment.

By this mater, as depicted in FIG. 6, an electrode structure which includes an electrode post 30 formed from the seed layer 20a, the Cu layer 30a, the Ni layer 30b, and the Au layer 30c, and the joining In layer 30d provided on the upper end surface of the electrode post 30, is formed. The electrode post 30 is formed to be electrically connected to the penetration electrode 16.

As an example of the shape of the electrode post 30, the electrode post 30 is formed as an electrode having a column shape. At the same time, a joining portion 24 like a ring shape is formed from the seed layer 20a and the metal portion 24a such that the element mounting area A is surrounded by the joining portion 24. As an example of the arrangement of the joining portion 24, the joining portion 24 is formed like a frame shape with a rectangle.

The height of the electrode post 30 containing the joining In layer 30d is set to about 55.1 μm in the example of the thickness of each layer mentioned above. However, the height is properly adjusted according to the characteristic of the electronic component which is to be mounted. For example, the height is set from 30 to 80 μm. As mentioned hereinafter, the electronic component is flip-chip connected to the joining In layer 30d on the electrode post 30.

In this way, the electrode structure in which the joining metal layer made of the metal which is different from the metal material of the electrode post is provided on the electrode post, is formed. In the example of the electrode structure in the embodiment, the electrode post 30 is formed from the seed layer 20a, the Cu layer 30a, the Ni layer 30b, and the Au layer 30c. And the joining In layer 30d whose material is different from the metal material of the electrode post 30 is formed on the electrode post 30.

Also, as depicted in the fragmentary enlarged plan view of FIG. 6, the diameter D2 of the electrode post 30 is set larger than the diameter D1 of the through hole TH (penetration electrode 16). The electrode post 30 is formed to cover the whole of the end part of the through hole TH (penetration electrode 16). For example, the diameter D1 of the through hole TH is set to 60 μm, and the diameter D2 of the electrode post 30 is set to 80 μm. In this case, the covering amount L of the electrode post 30 from the outer periphery of the through hole TH is set to 10 μm.

As mentioned hereinafter, after the electronic component is flip-chip connected to the electrode post 30, the cap is joined in the vacuum atmosphere, and the electronic component is hermetically sealed in the cavity. At this time, because the Cu layer formed by the electroplating contacts the inner surface (insulating layer 12) in the through hole TH, the sufficient adhesiveness can not be obtained. Accordingly, in the case that the diameter of the electrode post 30 is set smaller than the diameter of the through hole TH, because the interface in the through hole TH that the adhesiveness is low is exposed, the vacuum leakage is generated and sufficient vacuum degree can not be obtained.

In this embodiment, the diameter of the electrode post 30 is set larger than the diameter of the through hole TH, thereby, the whole of the end part of the through hole TH can be sealed by the lowermost seed layer 20a in the electrode post 30. The adhesiveness of the seed layer formed by the sputtering method with the underlying layer (insulating layer 12 and penetration electrode 16) is excellent. Therefore, there is no fear that the vacuum leakage is generated, and it can make the inner part of the cavity sufficient vacuum degree.

In an example of FIG. 6, the electrode post 30 is arranged like a island just above a plurality of through holes TH (penetration electrode 16) of the first silicon wafer 10 respectively. As another mode, the electrode post may be arranged to the end part of the lead wiring which is connected to the penetration electrode 16 and extends outside. Also in this case, the connection pad of the lead wiring, whose diameter is larger than the diameter of the through hole TH is arranged just above the through hole TH (penetration electrode 16), thereby the through hole TH is sealed.

Then, as depicted in FIG. 7A, a MEMS element is prepared as the electronic component. In an example of FIG. 7A, an acceleration sensor is illustrated as MEMS element 40. In the acceleration sensor, in the case that the piezo-resistance method is employed, the deformation which is generated in the spring part by the acceleration is detected, by the piezo-resistance element which is arranged to the siring part that connects the sensor element movable portion and the fixing portion. Otherwise, in the case that the capacitance detecting method is employed, the change of the capacitance between the sensor element movable portion and the fixing portion is detected.

In the MEMS element 40 in FIG. 7A, the movable portion 40a is arranged to the periphery side, and the connection electrode 42 is arranged to the center part. The connection electrode 42 of the MEMS element 40 includes the structure that the gold (Au) layer is formed at the outermost part. The connection electrode 42 of the MEMS element 40 may be formed from Au layer over all, or may be formed from laminated structure that only uppermost layer is formed from the Au layer.

Then, as depicted in FIG. 7B, the connection electrode 42 of the MEMS element 40 is flip-chip connected to the joining In layer 30d on the electrode post 30 which is provided to the first silicon wafer 10. That is, the connection electrode 42 (Au layer) of the MEMS element 40 is arranged on the joining In layer 30d (FIG. 6) on the electrode post 30 which is provided to the first silicon wafer 10, and the MEMS element 40 is pressed downward, while heating at the temperature of 200° C.

By this matter, the joining In layer 30d on the electrode post 30 and the Au layer of the connection electrode 42 of the MEMS element 40 react and they are alloyed, and the Au In alloy layer 31 is formed in the interface between them. Thereby, the connection electrode 42 of the MEMS element 40 and the electrode post 30 are joined. That is, the alloy layer is formed by the joining In layer 30d and the metal material of the connection electrode 42.

Furthermore, contrary to the mode mentioned above, the joining Au layer is formed on the electrode post 30 provided to the first silicon wafer 10, and the In layer is formed to the outermost part of the connection electrode 42 of the MEMS element 40. Thereby the electrode post 30 and the connection electrode 42 of the MEMS element 40 may be joined by the Au In alloy layer 31.

In this embodiment, the connection electrode 42 of the MEMS element 40 is fixed to the electrode post 30 provided to the first silicon wafer 10 by the Au In alloy layer 31 without using the adhesive. A plurality of electrode posts 30 can be formed by plating method such that those height may become uniform.

Accordingly, since the metal layer of the electrode post 30 under the joining In layer 30d functions as the post whose height is uniform.

Therefore, the MEMS element 40 can be mounted in a state that the levelness is high. That is, the MEMS element 40 can be arranged in parallel to the substrate surface of the first silicon wafer 10. By this matter, it is possible to draw out the performance of the high-performance MEMS element sufficiently.

At this time, most of the joining In layer 30d on the electrode post 30 reacts with the connection electrode 42 (gold layer) of the MEMS element 40, thus it becomes the Au In alloy layer 31. In this case, also the Au layer 30c in the electrode post 30 reacts, thus it may become the part of the Au In alloy layer 31. The meting temperature of the joining In layer 30d is relatively low at 180 to 200° C., but the meting temperature increases to 500° C. by becoming the Au In alloy layer 31.

Accordingly, even when the device is utilized in the high temperature atmosphere of at 200° C. or more, the sufficient reliability of the electric connection between the MEMS element 40 and the electrode post 30 can be obtained.

Furthermore, in the MEMS element 40 mentioned above, the movable portion 40a is arranged in the periphery side, contrary, the MEMS element in which movable portion is provided in the center part and the connection electrode is provided in the periphery side may be used. In this case, as mentioned above, the connection electrode of the MEMS element is joined to the electrode post formed to the end part of the lead wiring which extends from the penetration electrode 16 to the outside.

Alternatively, according to the arrangement of the connection electrode 42 of the MEMS element 40, the arrangement of the penetration electrode 16 and the electrode post 30 is changed and formed.

Then, as depicted in FIG. 8A, a second silicon wafer 50 for obtaining a cap is prepared. A plurality of cavities C (concave portions) are provided in the second silicon wafer 50. Protruding portions 50a which are arranged to connect each other like a lattice are formed in the second silicon wafer 50, thereby a plurality of cavities C are defined. As an example of the shape of the protruding portion 50a, it is formed like a frame shape with a rectangle in the planar view.

Then, the protruding portion 50a of the second silicon wafer 50 is provided to the part corresponding to the joining portion 24 provided to the first silicon wafer 10 mentioned above. Also, the cavity C of the second silicon wafer 50 is provided to correspond to the part where the MEMS element 40 is housed.

The protruding portion 50a and the cavity C of the second silicon wafer 50 is formed by forming a mask having the desired opening portions on the silicon wafer, and processing the silicon wafer by anisotropic dry etching through the opening portions of the mask.

Further, a joining portion 50b whose outermost part is made of In layer is formed to the tip of the protruding portion 50a of the second silicon wafer 50. As the forming method of the joining portion 50b, first, a seed layer (Cu layer or the like) is formed on the whole surface of the cavity C side of the second silicon wafer 50, Subsequently, a plating resist (not shown) in which opening portions are provided on the protruding portion 50a is formed.

Then, an In layer is formed in the opening portions of the plating resist by the electroplating that utilizes the seed layer as a plating power feeding path. Further, after the plating resist is removed, the seed layer is etched while using the In layer as a mask. By this matter, the joining portion 50b formed from the seed layer and the In layer is obtained to the tip of the protruding portion 50a of the second silicon wafer 50.

Then, as depicted in FIG. 8B, the joining portion 50b of the second silicon wafer 50 is arranged on the joining portion 24 of the first silicon wafer 10, and the second silicon wafer 50 is pressed downward, while heating at the temperature of 200° C.

Accordingly, the lowermost In layer of the joining portion 50b of the second silicon wafer 50 and the uppermost Au layer of the joining portion 24 of the first silicon wafer 10 react and are alloyed, thus the Au In alloy layer 51 is formed in the interface between them and the both are joined.

The joining of the first silicon wafer 10 and the second silicon wafer 50 is performed in the vacuum atmosphere. And the MEMS element 40 is housed and hermetically sealed in the cavity C in a state that the inner part of the cavity C of the second silicon wafer 50 becomes the vacuum.

Furthermore, contrary to the mode mentioned above, the In layer is formed to the uppermost part of the joining portion 24 of the first silicon wafer 10, and the Au layer is formed to the outermost part of the joining portion 50b of the second silicon wafer 50, thereby the both may be joined by the Au In alloy layer 51.

In this embodiment, since the adhesive is not used unlike the relater art, when the MEMS element 40 is hermetically sealed in the cavity C with the vacuum atmosphere, there is no fear that the constituent in the adhesive volatilizes and the vacuum degree lowers. Therefore, the MEMS element can be hermetically sealed in the cavity C with desired vacuum degree.

Also, as mentioned above, the diameter of the electrode post 30 provided to the first silicon wafer 10 is set larger than the diameter of the through hole TH. Therefore, the interface that the adhesiveness is low, between the through hole TH and the penetration electrode 16 is sealed by the lowermost seed layer 20a in the electrode post 30. As a result, there is no fear that the vacuum leakage is generated from the interface between the through hole TH and the penetration electrode 16.

Accordingly, the MEMS element 40 is hermetically sealed in the cavity C which is set to the sufficient vacuum degree. Therefore, it is possible to draw out the performance of the high-performance MEMS element 40 sufficiently.

Subsequently, as depicted in FIG. 9, the second silicon wafer 50 and the first silicon wafer 10 in FIG. 8B are cut such that each element mounting area A is obtained and is divided, thus individual electronic component device 1 is obtained.

As depicted in FIG. 9, the electronic component device 1 according to the first embodiment, a silicon wiring substrate 5 is used as the interposer. In the silicon wiring substrate 5, through holes TH are provided in a silicon substrate 10x, and an insulating layer 12 is formed on the both surfaces of the silicon substrate 10x and the inner surface of the through holes TH.

The penetration electrode 16 is formed in the through holes TH in the silicon substrate 10x respectively. The wiring layer 20 connected to the penetration electrode 16 is formed on the lower surface of the silicon substrate 10x. Also, the solder resist 22 in which opening portions 22a are provided on the connection parts of the wiring layer is formed on the lower surface of the silicon substrate 10x. The contact layer 20x made of Ni/Au plating layer, or the like is formed on the connection parts of the wiring layer 20 respectively.

Further, the electrode post 30 connected to the penetration electrode 16 is formed to stand upward on the upper surface side of the silicon substrate 10x. The electrode post 30 is arranged just above the penetration electrode 16, and is formed by laminating the seed layer 20a and metal post 32 sequentially from the bottom.

In this way, in the silicon wiring substrate 5, the electrode post 30 and the wiring layer 20 are connected each other via the penetration electrode 16.

In the step of the wiring substrate before the MEMS element 40 is to be mounted, as to the silicon wiring substrate 5 in FIG. 9, the joining In layer 30d (joining metal layer (FIG. 6)) whose material is different from the metal material of the electrode post 30 is provided on the electrode post 30.

Further, the connection electrode 42 of the MEMS element 40 is flip-chip connected to the electrode post 30 of the silicon wiring substrate 5. The electrode post 30 of the silicon wiring substrate 5 and the connection electrode 42 of the MEMS element 40 are directly joined by the Au In alloy layer 31.

In this embodiment, the mode in which the connection electrode 42 of the MEMS element 40 and electrode post 30 of the silicon wiring substrate 5 are joined by the Au In alloy layer 31, is exemplified. The both may be joined by various alloy layer which includes the metal which is different from the metal material of the electrode post 30.

In this embodiment, as the electrode post, the electrode post 30 (FIG. 7B) having the laminated structure made of Cu layer 30a, Ni layer 30b, and Au layer 30c is exemplified. As the alloy layer which includes the metal which is different from the metal material of the electrode post 30, the Au In alloy layer 31 is exemplified.

Also, the cap silicon substrate 50x is arranged on the silicon wiring substrate 5 such that the MEMS element 40 mounted on the silicon wiring substrate 5 is housed in the cavity C of the cap silicon substrate 50x The joining portion 50b provided to the protruding portion 50a of the cap silicon substrate 50x is joined to the joining portion 24 of the silicon wiring substrate 5 by the Au In alloy layer 51. The joining portion 50b like a ring shape of the cap silicon substrate 50x is joined to the joining portion 24 like a ring shape of the silicon wiring substrate 5, thereby the cavity C is hermetically sealed with the vacuum state.

In this way, the MEMS element 40 mounted to the electrode post 30 of the silicon wiring substrate 5 is housed in the cavity C of the cap silicon substrate 50x, and is hermetically sealed with the vacuum state.

In the electronic component device 1 according to the first embodiment, as mention above, the MEMS element 40 is joined to the electrode post of the silicon wiring substrate 5 by the Au In alloy layer 31 without using the adhesive. Accordingly, the MEMS element 40 can be mounted with the levelness of high precision.

Also, as mentioned above, when the MEMS element 40 is mounted, the adhesive is not used, thereby the volatilization constituents of the adhesive is not generated. Accordingly, when the MEMS element 40 is hermetically sealed in the cavity C with the vacuum state, there is no fear that the vacuum degree lowers.

Additionally, as mentioned above, the interface that the adhesiveness is low, between the through hole TH and the penetration electrode 16 is sealed by the electrode post 30. Thereby, there is no fear that the vacuum leakage is generated from the interface between the through hole TH and the penetration electrode 16.

In this way, the MEMS element 40 is mounted with the levelness of high precision, and is hermetically sealed in the cavity C having sufficient vacuum degree. Therefore, it is possible to draw out the performance of the high-performance MEMS element 40 sufficiently.

Also, in this embodiment, the method in which the MEMS element 40 is connected by the wire like the related art is not be employed, and the connection electrode 42 of the MEMS element 40 is directly connected to the electrode post 30 by the flip-chip joining. Therefore, because it is not necessary to consider the height of the loop of the wire, thinner body of the electronic component device can be attained. Also, it is not necessary to arrange the electrode for connecting the wire to the outside of the MEMS element 40. Accordingly, the mounting area can be reduced, and the small size of the electronic component device can be attained.

Also, the meting temperature of the Au In alloy layer 31 is about 500° C. Accordingly, even when the device is utilized in the high temperature atmosphere at 200° C. or more, the sufficient reliability of the electric connection between the MEMS element 40 and the electrode post 30 can be obtained.

Figure 10:
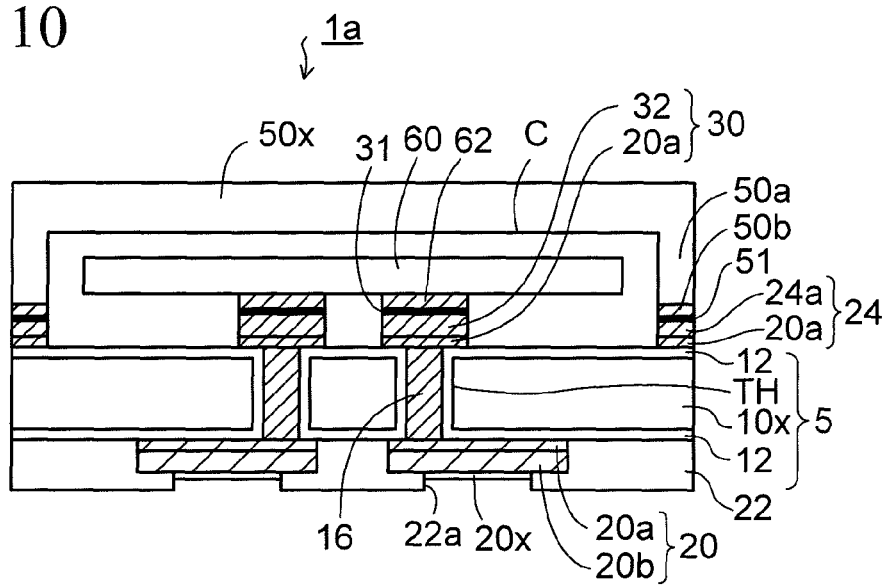
FIG. 10 is a sectional view depicting an electronic component device according to a first variation in a first embodiment.

In FIG. 10, an electronic component device 1a according to a first variation in a first embodiment is illustrated. As depicted in FIG. 10, in the electronic component device 1a in the first variation, instead of the MEMS element 40, the connection electrode 62 of the semiconductor element (LSI chip) is flip-chip joined to the electrode post 30 of the silicon wiring substrate 5 by the Au In alloy layer 31. Other constitution elements are the same as FIG. 9.

Specially, in the case that a logic LSI (CPU or the like) that the amount of heat generation is large is used as the semiconductor element 60, in the conventional flip-chip joining, the crack is generated around the connection portion by occurrence of the thermal stress, or the like, thus sometimes the joining disruption occurs.

As depicted in FIG. 10, the semiconductor element 60 is mounted to separate upward from the silicon wiring substrate 5. Therefore, the stress is relaxed by the electrode post 30 including the soft Cu post, thus the occurrence of the joining disruption in the semiconductor element 60 can be prevented.

Furthermore, in the case that the semiconductor element 60 is used as the electronic component, it is not always necessary that the semiconductor element 60 is hermetically sealed by the cap silicon substrate 50x.

Figure 11:
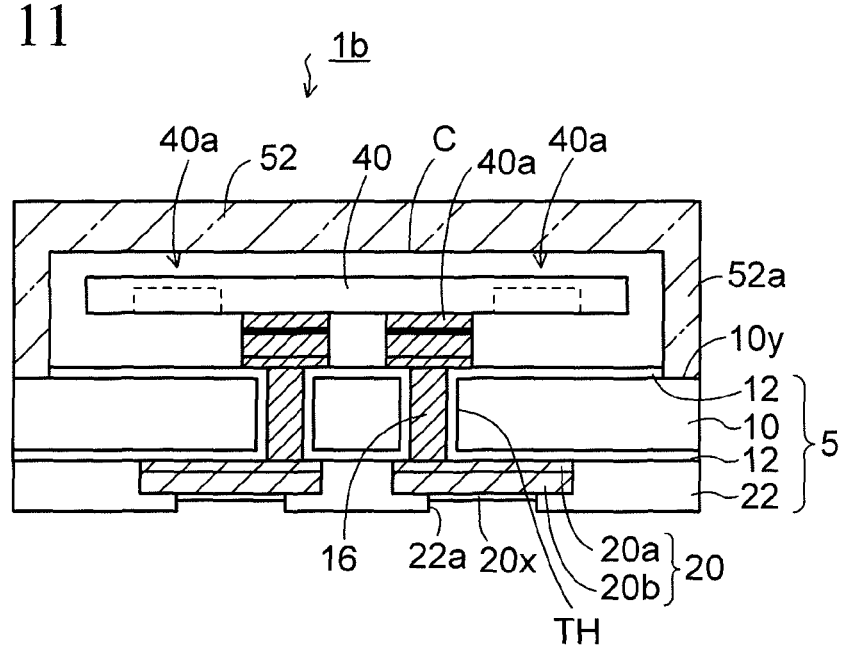
FIG. 11 is a sectional view depicting an electronic component device according to a second variation in a first embodiment.

In FIG. 11, an electronic component device 1b according to a second variation in a first embodiment is illustrated. As depicted in FIG. 11, in the electronic component device 1b of the second variation, instead of the cap silicon substrate 50x, a cap glass substrate 52 is used.

A protruding joining portion 52a of the cap glass substrate 52 is joined to a silicon joining portion 10y of the peripheral part of the silicon wiring substrate 5 by the anodic bonding.

The MEMS element 40 is hermetically sealed in the cavity C of the cap glass substrate 52 with the vacuum state.

The cap glass substrate 52 in which the cavity C is provided is formed by forming a mask having desired opening portions on the glass wafer, and processing the parts of the glass wafer which is exposed from the opening portions of the mask by a sandblast method. Otherwise, the cap glass substrate 52 may be made by pouring the molten glass into the desired mold.

When the electronic component device 1b in the second variation is manufactured, in the steps of FIG. 5A to FIG. 6 mentioned above, the formation of the joining portion 24 is omitted, the insulating layer 12 of the peripheral part of each element mounting area A of the first silicon wafer 10 is etched and removed, thus the silicon joining portion 10y is exposed with a ring shape.

Then, the protruding joining portion 52a of the glass wafer for obtaining the cap glass substrate 52 is joined to the silicon joining portion 10y of the first silicon wafer 10 by the anodic bonding. As condition of the anodic bonding, for example, in a state that the first silicon wafer 10 and the glass wafer are heated at the temperature of 300 to 400° C., the voltage of 500 V to 1 KV is applied between the both.

By this matter, the large electrostatic attractive force is generated between the first silicon wafer 10 and the glass wafer, and they chemical-bond in the interface of them. Thereby, the protruding joining portion 52a of the glass wafer is joined to the silicon joining portion 10y of the first silicon wafer 10.

Also, at the time of the anodic bonding as well, it is performed in the vacuum atmosphere, the MEMS element 40 is housed and hermetically sealed in the cavity C of the glass wafer with the vacuum state.

Subsequently, the glass wafer and the first silicon wafer 10 are cut, thus individual electronic component device in which the cap glass substrate 52 is joined on the silicon wiring substrate 5 is obtained.

Otherwise, especially the figure is not shown, a glass wiring substrate may be used instead of the silicon wiring substrate 5. In the case that the glass wiring substrate is used, the glass wiring substrate having similar structure to the silicon wiring substrate 5 can be obtained by processing the glass wafer by the laser or the drill. In the case that the glass wiring substrate is used, the formation of the insulating layer 12 (FIG. 3A) can be omitted.

Alternatively, the cap silicon substrate may be joined on the glass wiring substrate, or the cap glass substrate may be joined on the glass wiring substrate.

(Second Embodiment)

Figure 12:
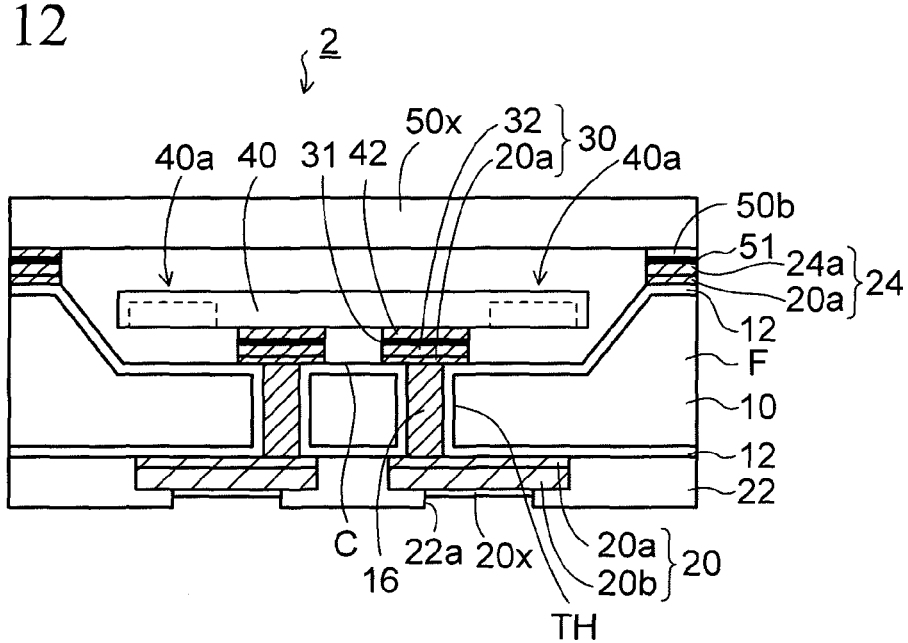
FIG. 12 is a sectional view depicting an electronic component device according to a second embodiment.

FIG. 12 is a sectional view depicting an electronic component device according to a second embodiment. A different aspect of the second embodiment from the first embodiment resides in that, the cavity is formed to the silicon wiring substrate side, the cavity is capped by the cap silicon substrate like a flat plate. In the second embodiment, the same reference symbols are affixed to the same elements as those in the first embodiment, and their detailed explanation will be omitted herein.

As depicted in FIG. 12, in the electronic component device 2 according to the second embodiment, the cavity C (concave portion) is provided in the center part of the silicon wiring substrate 5, thus the frame portion F like a ring shape is arranged in peripheral part. Then, like the first embodiment, the penetration electrodes 16 which penetrate the silicon substrate are provided to the bottom part of the cavity C. Also, the electrode post 30 is formed to stand upward on the penetration electrodes 16 respectively. Further, like the first embodiment, the connection electrode of the MEMS element 40 is connected to the electrode post 30 by the Au In alloy layer 31.

Also, the cap silicon substrate 50x like a flat plate is arranged to the frame portion F of the silicon wiring substrate 5. Like the first embodiment, the joining portion 50b of the cap silicon substrate 50x and the joining portion 24 on the frame portion F of the silicon wiring substrate 5 are joined by the Au. In ally layer 51.

The silicon wiring substrate 5 in which the cavity C is provided, in FIG. 12, is obtained basically by arranging a mask in which opening portions are provided on the part where the cavity are arranged, on the back surface side of the first silicon wafer 10, after the step of FIG. 2C mentioned above, and half-etching the silicon wafer through the opening portion of the mask until the cavity is communicated with the hole portions 10a.

The electronic component device 2 in the second embodiment has similar advantage to the electronic component device 1 in the first embodiment.

Figure 13:
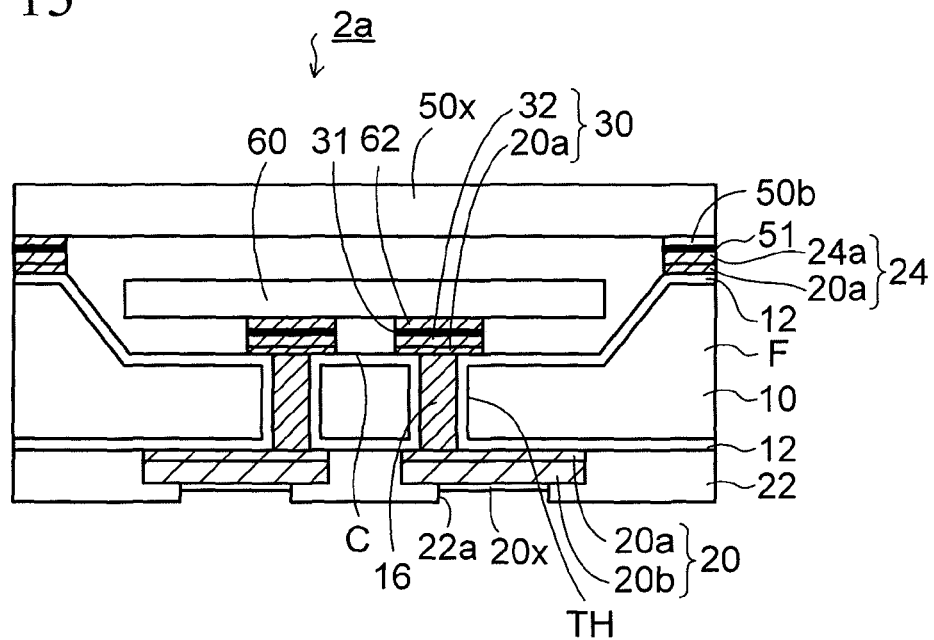
FIG. 13 is a sectional view depicting an electronic component device according to a first variation in a second embodiment.

In FIG. 13, an electronic component device 2a according to a first variation in a second embodiment is illustrated.

As depicted in FIG. 13, like the first variation (FIG. 10) in the first embodiment, in FIG. 12 mentioned above, instead of MEMS element 40, the semiconductor element 60 such as the logic LSI or the like may be mounted similarly.

Figure 14:
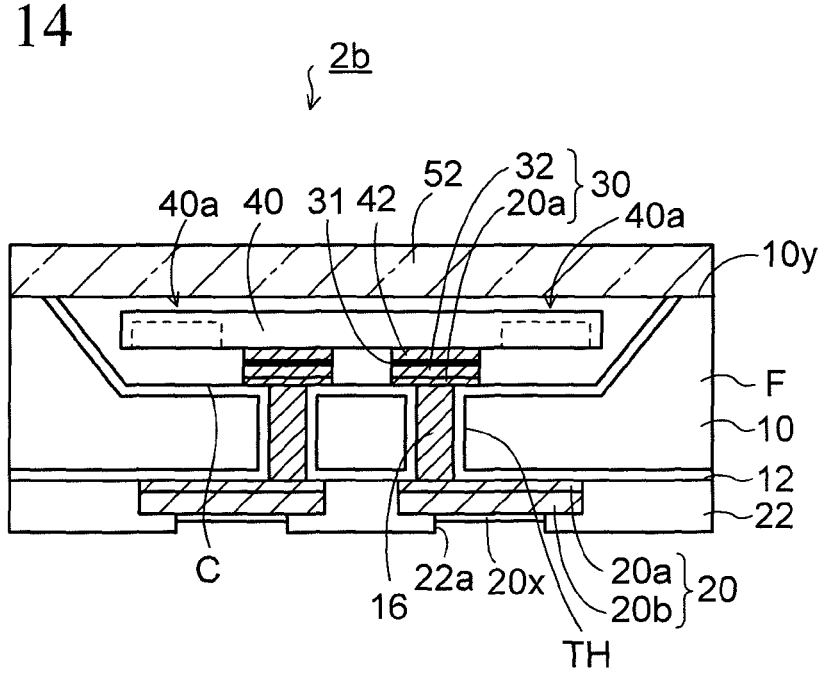
FIG. 14 is a sectional view depicting an electronic component device according to a second variation in a second embodiment.

In FIG. 14, an electronic component device 2b according to a second variation in a second embodiment is illustrated.

As depicted in FIG. 14, like the second variation (FIG. 11) in the first embodiment, in FIG. 12 mentioned above, instead of the cap silicon substrate 50x, the cap glass substrate 52 may be anodic bonded to the silicon joining portion 10y of the upper surface of the frame portion F in the silicon wiring substrate 5.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. An electronic component device, comprising:
   a substrate;
   a penetration electrode penetrating to a thickness direction of the substrate, provided in the substrate;
   an electrode post, provided on an end part of the penetration electrode, electrically connected to the penetration electrode, made of a metal material, and protruding upward from an upper face of the substrate;
   wherein a diameter of the electrode post is set larger than a diameter of the penetration electrode, and a cross-sectional area of the electrode post is the same over an entire height direction thereof; and
   a MEMS element having a movable portion on a lower face side thereof, whose connection electrode is connected to the electrode post;
   wherein space exists between a lower face of the MEMS element and the upper face of the substrate, the connection electrode of the MEMS element and the electrode post are joined by an alloy layer including a metal which is different from the metal material of the electrode post.

2. An electronic component device according to claim 1, wherein the alloy layer is a gold indium alloy layer.

3. An electronic component device according to claim 1, wherein a cap is provided on the substrate, the MEMS element is hermetically sealed in a cavity between the substrate and the cap.

4. An electronic component device according to claim 1, wherein the connection electrode of the MEMS element is formed on a lower face of the MEMS element, and the connection electrode is connected to a top end of the electrode post.

5. An electronic component device according to claim 1, wherein the MEMS element is selected from an acceleration sensor, a pressure sensor, and a gyroscope.

* * * * *